United States Patent
Crabtree

(10) Patent No.: US 6,551,403 B1
(45) Date of Patent: Apr. 22, 2003

(54) SOLVENT PRE-WET SYSTEM FOR WAFERS

(75) Inventor: Mark J. Crabtree, Rocklin, CA (US)

(73) Assignee: NEC Electronics, Inc., Santa Clara, CA (US)

(*) Notice: Subject to any disclaimer, the term of this patent is extended or adjusted under 35 U.S.C. 154(b) by 42 days.

(21) Appl. No.: 09/605,447

(22) Filed: Jun. 28, 2000

(65) Prior Publication Data (65)

Related U.S. Application Data

(60) Provisional application No. 60/207,114, filed on May 25, 2000, and provisional application No. 60/207,819, filed on May 30, 2000.

(51) Int. Cl.[7] .............................. B05B 7/06; B05C 5/00
(52) U.S. Cl. ........................................ 118/313; 118/323
(58) Field of Search .......................... 118/313, 52, 612, 118/320, 321, 323, 500; 396/611; 427/240

(56) References Cited

U.S. PATENT DOCUMENTS

| | | | | |
|---|---|---|---|---|
| 5,250,114 A | * | 10/1993 | Konishi et al. ............. | 118/321 |
| 5,261,611 A | * | 11/1993 | Huxford ..................... | 239/690 |
| 5,514,215 A | * | 5/1996 | Takamatsu et al. ......... | 118/313 |
| 6,073,342 A | * | 6/2000 | Asai et al. ................... | 29/740 |
| 6,268,013 B1 | * | 7/2001 | Akimoto et al. ............. | 427/8 |
| 6,284,044 B1 | * | 9/2001 | Sakamoto et al. .......... | 118/219 |

* cited by examiner

Primary Examiner—Richard Crispino
Assistant Examiner—Yewebdar T. T.
(74) Attorney, Agent, or Firm—Skjerven Morrill LLP

(57) ABSTRACT

A system for improving manufacture, said system including but not limited to a Polyimide solvent dispensing nozzle proximate to a Polyimide dispensing nozzle. In one embodiment, the Polyimide solvent dispensing nozzle proximate to a Polyimide dispensing nozzle further includes but is not limited to the Polyimide solvent dispensing nozzle coupled with a bracket assembly adjustable in three dimensions. In one embodiment, the Polyimide solvent dispensing nozzle coupled with a bracket assembly adjustable in three dimensions further includes but is not limited to a bracket assembly adjustable in an x-axis direction, y-axis direction, and z-axis direction. In one embodiment, the Polyimide solvent dispensing nozzle proximate to a Polyimide dispensing nozzle further includes but is not limited to the Polyimide solvent dispensing nozzle mounted on an arm holding the Polyimide dispensing nozzle. In one embodiment, the Polyimide solvent dispensing nozzle mounted on an arm holding the Polyimide dispensing nozzle further includes but is not limited to the Polyimide solvent dispensing nozzle mounted with a bracket assembly adjustable such that the Polyimide solvent dispensing nozzle is centerable over a wafer holder. In one embodiment, the Polyimide solvent dispensing nozzle is fed by a Polyimide solvent reservoir. In one embodiment, at least one dispense/suckback valve is interposed between the Polyimide solvent dispensing nozzle and the Polyimide solvent reservoir. In one embodiment, at least one air operated valve is operably connected with interposed between the Polyimide solvent dispensing nozzle and the Polyimide solvent reservoir.

20 Claims, 14 Drawing Sheets

| Section | Page No. |
|---|---|
| Dainippon Screen 623: NMP PreWet Nozzle Assembly | 2 |
| Dainippon Screen 623: NMP PreWet Nozzle Position During Dispense | 3 |
| Dainippon Screen 623: NMP PreWet Chemical Supply System | 4 |
| Dainippon Screen 623: NMP PreWet Dispense/Suskback Valve Assembly | 5 |
| Dainippon Screen 623: NMP PreWet Piping Schematic | 6 |
| Dainippon Screen 623: NMP PreWet Parts List | 7 |
| Drawing: NMP PreWet Nozzle Bracket Assembly Drawing | 8 |
| Drawing: NMP PreWet Nozzle Bracket Manufacturing Drawing | 9 |
| Drawing: NMP PreWet Valve Mounting Bracket Manufacturing Drawing | 10 |
| Drawing: NMP PreWet Drain Manufacturing Drawing | 11 |

*FIG. 1*

| No. | Part No. | Description | Manufacture | Qty | Price ea. | Price ext. |
|---|---|---|---|---|---|---|
| 1 | SS-400-1-4RT | Fitting, stainless steel, 1/4" tube to 1/4" P-ISO | Swagelok | 1 | 5.20 | 5.20 |
| 2 | AMDSZ0-X20 | Valve, dispense/suckback | CKD | 1 | 318.27 | 318.27 |
| 3 | SC-M5-F-X2 | Speed controller | CKD | 2 | 10.85 | 21.70 |
| 4 | SC-M5-L-X1 | Speed controller | CKD | 1 | 10.85 | 10.85 |
| 5 | MS-5N | Fitting, nipple | SMC | 1 | 1.16 | 1.16 |
| 6 | M-5UT | Fitting, union | SMC | 1 | 1.52 | 1.52 |
| 7 | MS-5H-4 | Fitting, straight | SMC | 1 | 6.03 | 6.03 |
| 8 | MS-5-HLH-4 | Fitting, elbow | SMC | 1 | 7.90 | 7.90 |
| 9 | 0.170" ID x 0.250" O.D. | Tubing, FEP | Ryan Herco | 5' | 1.29/ft | 6.45 |
| 10 | 2mm x 4mm | Tubing, FEP | Ryan Herco | 4' | 0.65/ft | 2.60 |
| 11 | TU0425B-20 | Tubing, 4x2.5mm Polyurethane tubing | SMC | 2" | 0.28/ft | 0.28 |
| 12 | WGFV16KP2 | 16 stack Teflon filter with Kalrez o-ring | Millipore | 1 | 190.00 | 190.00 |
| 13 | SS-QC6-D-6PFK7K | Chemical quick connector with Kalrez o-ring | Swagelok | 1 | 65.20 | 65.20 |
| 14 | SS-QC4-D-4PFK1K | Chemical quick connector with Kalrez o-ring | Swagelok | 1 | 35.50 | 35.50 |
| | | | | | Total Per Track | 672.66 |

FIG. 7

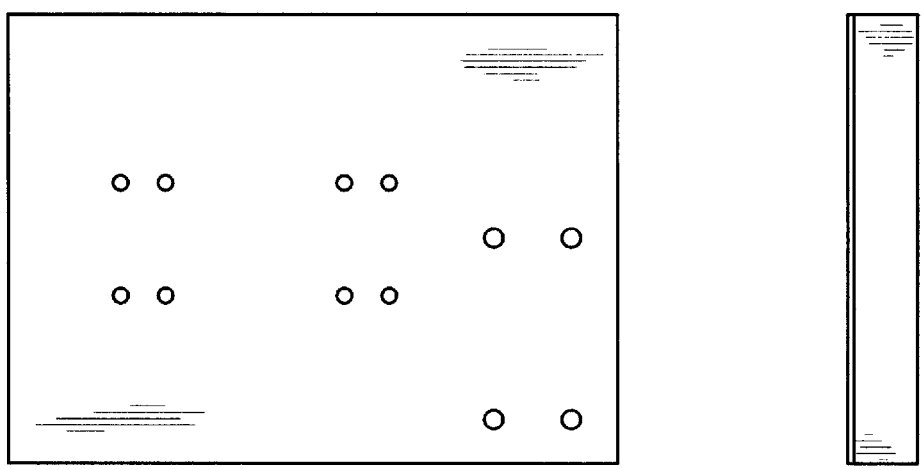
FIG. 10

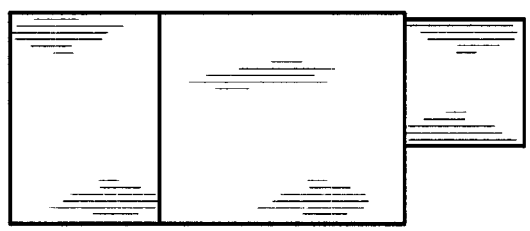
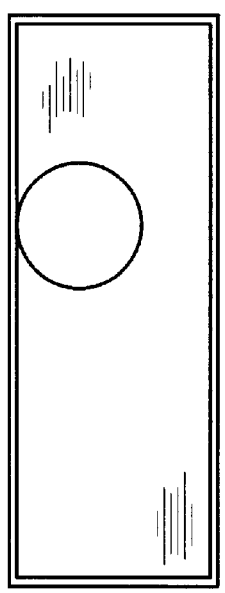 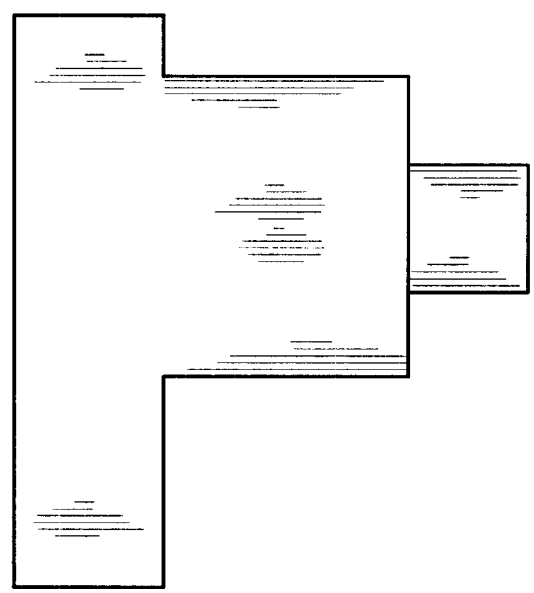
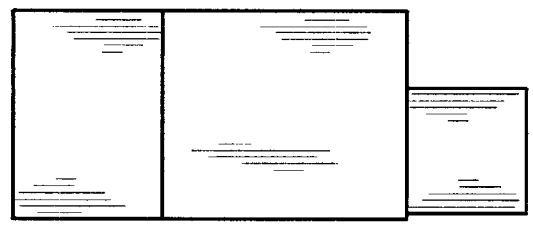
FIG. 11

| STEP | 1 | 2 | 3 | 4 | 5 | 6 | 7 | 8 |
|---|---|---|---|---|---|---|---|---|
| SPIN N | 0 | 0 | 50 | 175 | 175 | 195 | 500 | 0 |
| T1 | 0.5 | 0.5 | 0.5 | 3.0 | 0.5 | 0.5 | 0.1 | 0.5 |
| T2 | 7.5 | 1.5 | 15.0 | 10.0 | 17.0 | 10 | 0.5 | 0.5 |
| T3 | 0.0 | 0.0 | 0.0 | 0.0 | 0.0 | 0.0 | 0.0 | 0.0 |
| T4 | 0.0 | 0.0 | 0.0 | 0.0 | 0.0 | 0.0 | 0.0 | 0.0 |
| C1 | 0 | 0 | 0 | 0 | 0 | 0 | 0 | 0 |
| C2 | 1 | 8 | 8 | 0 | 0 | 0 | 0 | 0 |
| C3 | 8 | 0 | 0 | 0 | 0 | 0 | 0 | 0 |
| C4 | 9 | 0 | 0 | 0 | 0 | 0 | 0 | 0 |
| C5 | 0 | 0 | 0 | 0 | 0 | 0 | 0 | 0 |
| C6 | 0 | 0 | 0 | 0 | 0 | 0 | 0 | 0 |
| C7 | 0 | 0 | 0 | 0 | 0 | 0 | 0 | 0 |
| C8 | 0 | 0 | 0 | 0 | 0 | 0 | 0 | 0 |
| M1 | 1 | 0 | 1 | 0 | 0 | 0 | 0 | 0 |
| P1x | 3 | 7 | 1 | 0 | 0 | 0 | 0 | 0 |
| P1y | 0 | 0 | 0 | 0 | 0 | 0 | 0 | 0 |
| V1 | 0.0 | 0.0 | 0.0 | 0.0 | 0.0 | 0.0 | 0.0 | 0.0 |
| M2 | 0 | 0 | 0 | 0 | 0 | 0 | 0 | 0 |
| P2x | 0 | 0 | 0 | 0 | 0 | 0 | 0 | 0 |
| P2y | 0 | 0 | 0 | 0 | 0 | 0 | 0 | 0 |
| V2 | 0.0 | 0.0 | 0.0 | 0.0 | 0.0 | 0.0 | 0.0 | 0.0 |

← 1200

| STEP | 1 | 2 | 3 | 4 | 5 | 6 | 7 | 8 | 9 | 10 | 11 |
|---|---|---|---|---|---|---|---|---|---|---|---|
| SPIN N | 200 | 200 | 200 | 200 | 0 | 0 | 50 | 130 | 155 | 500 | 0 |
| T1 | 0.5 | 0.0 | 0.0 | 0.5 | 0.5 | 0.5 | 0.5 | 0.5 | 0.5 | 0.1 | 0.5 |
| T2 | 2.0 | 2.0 | 1.0 | 4.0 | 7.5 | 1.0 | 12.0 | 15.0 | 15.0 | 0.5 | 0.5 |
| T3 | 0.0 | 0.0 | 0.0 | 0.0 | 0.0 | 0.0 | 0.0 | 0.0 | 0.0 | 0.0 | 0.0 |
| T4 | 0.0 | 0.0 | 0.0 | 0.0 | 0.0 | 0.0 | 0.0 | 0.0 | 0.0 | 0.0 | 0.0 |
| C1 | 0 | 0 | 0 | 0 | 0 | 0 | 0 | 0 | 0 | 0 | 0 |
| C2 | 0 | 6 | 0 | 0 | 1 | 8 | 8 | 0 | 0 | 0 | 0 |
| C3 | 0 | 0 | 0 | 0 | 8 | 0 | 0 | 0 | 0 | 0 | 0 |
| C4 | 0 | 0 | 0 | 0 | 9 | 0 | 0 | 0 | 0 | 0 | 0 |
| C5 | 0 | 0 | 0 | 0 | 0 | 0 | 0 | 0 | 0 | 0 | 0 |
| C6 | 0 | 0 | 0 | 0 | 0 | 0 | 0 | 0 | 0 | 0 | 0 |
| C7 | 0 | 0 | 0 | 0 | 0 | 0 | 0 | 0 | 0 | 0 | 0 |
| C8 | 0 | 0 | 0 | 0 | 0 | 0 | 0 | 0 | 0 | 0 | 0 |
| M1 | 1 | 1 | 1 | 1 | 1 | 0 | 1 | 0 | 0 | 0 | 0 |
| P1x | 2 | 2 | 3 | 3 | 3 | 7 | 1 | 0 | 0 | 0 | 0 |
| P1y | 0 | 0 | 0 | 0 | 0 | 0 | 0 | 0 | 0 | 0 | 0 |
| V1 | 0 | 0 | 0 | 0 | 0.0 | 0.0 | 0.0 | 0.0 | 0.0 | 0.0 | 0.0 |
| M2 | 0 | 0 | 0 | 0 | 0 | 0 | 0 | 0 | 0 | 0 | 0 |
| P2x | 0 | 0 | 0 | 0 | 0 | 0 | 0 | 0 | 0 | 0 | 0 |
| P2y | 0 | 0 | 0 | 0 | 0 | 0 | 0 | 0 | 0 | 0 | 0 |
| V2 | 0 | 0 | 0 | 0 | 0.0 | 0.0 | 0.0 | 0.0 | 0.0 | 0.0 | 0.0 |

STANDARD SEQ (NO PRE-WET) AND PRE-WET SEQ CHARTS KEY

With respect to the Standard Seq ( No Pre-Wet) and Pre-Wet Seq charts, the description of each component of the recipe is described below:

T1-Acceleration Time
T2-Total Time
T3 and T4-Chemical Ramp off / on trigger (NOT USED)
C1-C8-Chemical Place Holders
M1-Nozzle 1 Designator (Incase there are 2 nozzles)
P1x, P1y-nozzle position
V1-move velocity of nozzle 1
M2-Nozzle 2 Designator (NOT USED)
P2x, P2y-Nozzle 2 Position (NOT USED)
V2-Second Nozzle Velocity (NOT USED)

Chemicals:
1-PI Dispense
8-Exhaust Damper Closed
9-Suckback off

Summaries of Standard Seq (No Pre-Wet) and Pre-Wet Seq charts:

Standard:
PI is dispensed statically on the wafer. Wafer spins at appropriate RPM to spread PI to desired thickness.

PreWet:
NMP is dispensed dynamically. NMP dispense stops and wafer continues to spin unitl a thin film of NMP remains. The wafer stops spinning and PI is dispensed. Then the wafer spins at appropriate RPM to spread PI to desired thickness.

*FIG. 12B*

| STEP | 1 | 2 | 3 | 4 | 5 | 6 | 7 | 8 |
|---|---|---|---|---|---|---|---|---|
| SPIN N | 0 | 0 | 50 | 175 | 175 | 195 | 500 | 0 |
| T1 | 0.5 | 0.5 | 0.5 | 3.0 | 0.5 | 0.5 | 0.1 | 0.5 |
| T2 | 5.5 | 1.0 | 15.0 | 10.0 | 17.0 | 10 | 0.5 | 0.5 |
| T3 | 0.0 | 0.0 | 0.0 | 0.0 | 0.0 | 0.0 | 0.0 | 0.0 |
| T4 | 0.0 | 0.0 | 0.0 | 0.0 | 0.0 | 0.0 | 0.0 | 0.0 |
| C1 | 0 | 0 | 0 | 0 | 0 | 0 | 0 | 0 |
| C2 | 1 | 8 | 8 | 0 | 0 | 0 | 0 | 0 |
| C3 | 8 | 0 | 0 | 0 | 0 | 0 | 0 | 0 |
| C4 | 9 | 0 | 0 | 0 | 0 | 0 | 0 | 0 |
| C5 | 0 | 0 | 0 | 0 | 0 | 0 | 0 | 0 |
| C6 | 0 | 0 | 0 | 0 | 0 | 0 | 0 | 0 |
| C7 | 0 | 0 | 0 | 0 | 0 | 0 | 0 | 0 |
| C8 | 0 | 0 | 0 | 0 | 0 | 0 | 0 | 0 |
| M1 | 1 | 0 | 1 | 0 | 0 | 0 | 0 | 0 |
| P1x | 3 | 7 | 1 | 0 | 0 | 0 | 0 | 0 |
| P1y | 0 | 0 | 0 | 0 | 0 | 0 | 0 | 0 |
| V1 | 0.0 | 0.0 | 0.0 | 0.0 | 0.0 | 0.0 | 0.0 | 0.0 |
| M2 | 0 | 0 | 0 | 0 | 0 | 0 | 0 | 0 |
| P2x | 0 | 0 | 0 | 0 | 0 | 0 | 0 | 0 |
| P2y | 0 | 0 | 0 | 0 | 0 | 0 | 0 | 0 |
| V2 | 0.0 | 0.0 | 0.0 | 0.0 | 0.0 | 0.0 | 0.0 | 0.0 |

1300

1350

| STEP | 1 | 2 | 3 | 4 | 5 | 6 | 7 | 8 | 9 | 10 | 11 |
|---|---|---|---|---|---|---|---|---|---|---|---|
| SPIN N | 200 | 200 | 200 | 200 | 0 | 0 | 50 | 130 | 155 | 500 | 0 |
| T1 | 0.5 | 0.0 | 0.0 | 0.5 | 0.5 | 0.5 | 0.5 | 0.5 | 0.5 | 0.1 | 0.5 |
| T2 | 2.0 | 2.0 | 1.0 | 4.0 | 5.5 | 1.0 | 12.0 | 15.0 | 15.0 | 0.5 | 0.5 |
| T3 | 0.0 | 0.0 | 0.0 | 0.0 | 0.0 | 0.0 | 0.0 | 0.0 | 0.0 | 0.0 | 0.0 |
| T4 | 0.0 | 0.0 | 0.0 | 0.0 | 0.0 | 0.0 | 0.0 | 0.0 | 0.0 | 0.0 | 0.0 |
| C1 | 0 | 0 | 0 | 0 | 0 | 0 | 0 | 0 | 0 | 0 | 0 |
| C2 | 0 | 6 | 0 | 0 | 1 | 8 | 8 | 0 | 0 | 0 | 0 |
| C3 | 0 | 0 | 0 | 0 | 8 | 0 | 0 | 0 | 0 | 0 | 0 |
| C4 | 0 | 0 | 0 | 0 | 9 | 0 | 0 | 0 | 0 | 0 | 0 |
| C5 | 0 | 0 | 0 | 0 | 0 | 0 | 0 | 0 | 0 | 0 | 0 |
| C6 | 0 | 0 | 0 | 0 | 0 | 0 | 0 | 0 | 0 | 0 | 0 |
| C7 | 0 | 0 | 0 | 0 | 0 | 0 | 0 | 0 | 0 | 0 | 0 |
| C8 | 0 | 0 | 0 | 0 | 0 | 0 | 0 | 0 | 0 | 0 | 0 |
| M1 | 1 | 1 | 1 | 1 | 1 | 0 | 1 | 0 | 0 | 0 | 0 |
| P1x | 2 | 2 | 3 | 3 | 3 | 7 | 1 | 0 | 0 | 0 | 0 |
| P1y | 0 | 0 | 0 | 0 | 0 | 0 | 0 | 0 | 0 | 0 | 0 |
| V1 | 0 | 0 | 0 | 0 | 0.0 | 0.0 | 0.0 | 0.0 | 0.0 | 0.0 | 0.0 |
| M2 | 0 | 0 | 0 | 0 | 0 | 0 | 0 | 0 | 0 | 0 | 0 |
| P2x | 0 | 0 | 0 | 0 | 0 | 0 | 0 | 0 | 0 | 0 | 0 |
| P2y | 0 | 0 | 0 | 0 | 0 | 0 | 0 | 0 | 0 | 0 | 0 |
| V2 | 0 | 0 | 0 | 0 | 0.0 | 0.0 | 0.0 | 0.0 | 0.0 | 0.0 | 0.0 |

*FIG. 13*

SOLVENT PRE-WET SYSTEM FOR WAFERS

CROSS-REFERENCE

The present invention is related to the subject matter of the provisional United States Patent Applications entitled, "Solvent Pre-Wet System For Polyimide Coating Process and Polyimide Coating Process Using Solvent Pre-Wet", naming inventors Mark J. Crabtree and Joseph T. Siska, filed May 25, 2000, Ser. No. 60/207,114, and "Solvent Pre-Wet System For Polyimide Coating Process and Polyimide Coating Process Using Solvent Pre-Wet", naming inventors Mark J. Crabtree and Joseph T. Siska, filed May 30, 2000, Ser. No. 60/207,819. Applicants hereby claim the benefit under 35 U.S.C. §119(e) of both of the foregoing-referenced provisional applications. The contents of both of the foregoing-referenced provisional patent applications are hereby incorporated by reference herein in their entireties.

The present application is related to subject matter disclosed in the following co-pending application, which is hereby incorporated by reference in its entirety: United States patent application Ser. No. 09/605,454 entitled, "Coating Process Using Solvent Pre-Wet", naming Joseph T. Siska as inventor and filed substantially contemporaneously with the present application.

BACKGROUND OF THE INVENTION

1. Field of the Invention

This invention relates to quality control in the field of semiconductor wafer oriented manufacturing of integrated circuits.

2. Description of the Related Art

Integrated circuit manufacturing and testing requires a high degree of quality control. An integrated circuit (IC) is a miniature electric circuit composed of hundreds to tens of millions of discrete electronic circuit elements (e.g., transistors, resistors, capacitors, or inductors). Multiple ICs are manufactured, or formed, on semiconductor wafers (also known as integrated circuit wafers), through a series of oxidations, implants, controlled deposition of materials, and selective removal of materials. Manufacturing integrated circuit wafers typically requires upwards of between two hundred and four hundred discrete manufacturing steps. One discrete manufacturing step is the controlled deposition of Polyimide. Polyimide is a plastic coating, which is typically used as a "stress buffer." Generally, Polyimide is the last (or nearly last) coating applied to each semiconductor wafer. Once the manufacturing process is complete (e.g., the Polyimide is deposited), a wafer upon which the Polyimide has been deposited will be divided into individual die (or chips). Each functional die will thereafter typically be sold as an individual IC.

The Polyimide protects the die produced from the wafer from thermal expansion, so it is often described as a thermal stress buffer. In addition, Polyimide also works as a cushion between the chip and the packaging (a black epoxy that usually encapsulates the chip). For example, a chip, during its use, typically heats up and cools down (due to the dissipation of electrical energy as heat) causing the chip to thermally expand and contract. Polyimide works to allow chips coated with Polyimide to thermally expand and contract without sustaining excessive damage. Polyimide also works to ensure that chips coated with Polyimide don't become damaged by rubbing up against the chip's packaging in the process of such chips' thermal expansion and contraction. Polyimide thus constitutes a very important part of most integrated circuits.

Polyimide is relatively expensive substance. For example, in the years 1999 and 2000, Polyimide's cost has averaged about $500 per kilogram. Insofar as, in the related art, each standard wafer requires approximately 3.0 grams of Polyimide per 6 inch wafer, and each facility generally processes about 20,000 Polyimide requiring wafers per month, it is apparent that costs associated with Polyimide are relatively significant.

SUMMARY

The inventors named herein has invented a system which allows for reduced consumption of Polyimide per semiconductor wafer. In one embodiment, the system includes but is not limited to a Polyimide solvent dispensing nozzle proximate to a Polyimide dispensing nozzle. In one embodiment, the Polyimide solvent dispensing nozzle proximate to a Polyimide dispensing nozzle further includes but is not limited to the Polyimide solvent dispensing nozzle coupled with a bracket assembly adjustable in three dimensions. In one embodiment, the Polyimide solvent dispensing nozzle coupled with a bracket assembly adjustable in three dimensions further includes but is not limited to a bracket assembly adjustable in an x-axis direction, y-axis direction, and z-axis direction. In one embodiment, the Polyimide solvent dispensing nozzle proximate to a Polyimide dispensing nozzle further includes but is not limited to the Polyimide solvent dispensing nozzle mounted on an arm holding the Polyimide dispensing nozzle. In one embodiment, the Polyimide solvent dispensing nozzle mounted on an arm holding the Polyimide dispensing nozzle further includes but is not limited to the Polyimide solvent dispensing nozzle mounted with a bracket assembly adjustable such that the Polyimide solvent dispensing nozzle is centerable over a wafer holder. In one embodiment, the Polyimide solvent dispensing nozzle is fed by a Polyimide solvent reservoir. In one embodiment, at least one dispense/suckback valve is interposed between the Polyimide solvent dispensing nozzle and the Polyimide solvent reservoir. In one embodiment, at least one air operated valve is operably connected with interposed between the Polyimide solvent dispensing nozzle and the Polyimide solvent reservoir.

The foregoing is a summary and thus contains, by necessity, simplifications, generalizations and omissions of detail; consequently, those skilled in the art will appreciate that the summary is illustrative only and is not intended to be in any way limiting. Other aspects, inventive features, and advantages of the present invention, as defined solely by the claims, will become apparent in the non-limiting detailed description set forth below.

BRIEF DESCRIPTION OF THE DRAWINGS

The present invention may be better understood, and its numerous objects, features, and advantages made apparent to those skilled in the art by referencing the accompanying drawings.

FIG. 1 shows an index of FIGS. 2–11.

FIG. 7 depicts a parts list associated with numbered items in FIG. 6.

FIG. 10 depicts a drawing of a NMP pre-wet valve mounting bracket manufacturing drawing.

FIG. 11 shows a manufacturing drawing for solvent drain 306 illustrated and described in relation to FIG. 3.

FIG. 12A depicts screen prints taken from the Dainippon Screen 623 coater of (1) recipe 1200 containing a recipe which is used to control the dispensing of 1.3 grams of Polyimide from an unmodified Dainippon 623 coater, and (2) recipe 1250 containing a recipe which is used, in one embodiment, with the modified Dainippon Screen 623 system in order to control the both the dispensing of the Polyimide solvent (NMP) and the subsequent dispensing of 1.3 grams of Polyimide.

FIG. 12B shows key 1204, which explains to what the various entries in recipes 1200 and 1250 refer.

FIG. 13 shows screen prints taken from the Dainippon Screen 623 coater of (1) recipe 1300 containing a recipe which is used to control the dispensing of 1.15 grams of Polyimide from an unmodified Dainippon 623 coater machine, and (2) recipe 1350 containing a recipe which is used, in one embodiment, with the modified Dainippon 623 coater machine system in order to control the both the dispensing of the Polyimide solvent (NMP) and the subsequent dispensing of 1.15 grams of Polyimide.

The use of the same reference symbols in different drawings indicates similar or identical items.

DESCRIPTION OF THE PREFERRED EMBODIMENT(S)

The following sets forth a detailed description of at least the best contemplated mode for carrying out the independent invention(s) described herein. The description is intended to be illustrative and should not be taken to be limiting.

I. Devices

With respect to FIG. 1, shown is an index of FIGS. 2–11. The index depicted in FIG. 1 describes portions of FIGS. 2–11 in the context of a Dainippon Screen 623 coater. The Dainippon Screen 623 coater is manufactured by and available from the Dainippon Screen MFG. CO., LTD. having offices in RAKUSAI JAPAN.

Those having ordinary skill in the art will recognize that even though devices and processes are illustrated and discussed herein in the context of a Dainippon Screen 623 coater, use of the Dainippon Screen 623 coater is merely exemplary of such devices and processes used in association with coater machines.

Figure 2:
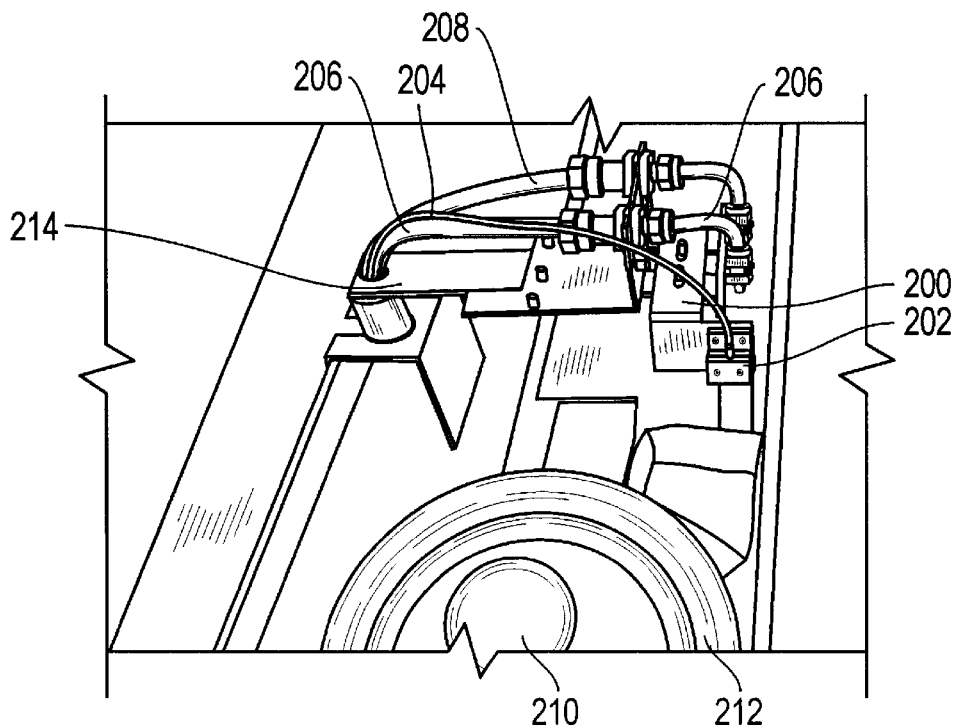
FIG. 2 depicts solvent dispensing nozzle bracket 200 and solvent dispensing nozzle block 202 (which collectively can be referred to as a "bracket assembly") and solvent dispensing line 204.

Referring now to FIG. 2, depicted are solvent dispensing nozzle bracket 200, and solvent dispensing nozzle block 202 (which collectively can be referred to as a "bracket assembly") and solvent dispensing line 204. Illustrated are Polyimide dispense lines 206, 208 in the upper portion of FIG. 2. The particular system shown in FIG. 2 has the capability of dispensing two different types of Polyimide (e.g., photosensitive and non-photosensitive); however, in the system shown only one type of Polyimide (non-photosensitive), is in use, and such Polyimide is being dispensed through Polyimide dispense line 206, which is illustrated a yellow chemical in dispense line 206.

Figure 8:
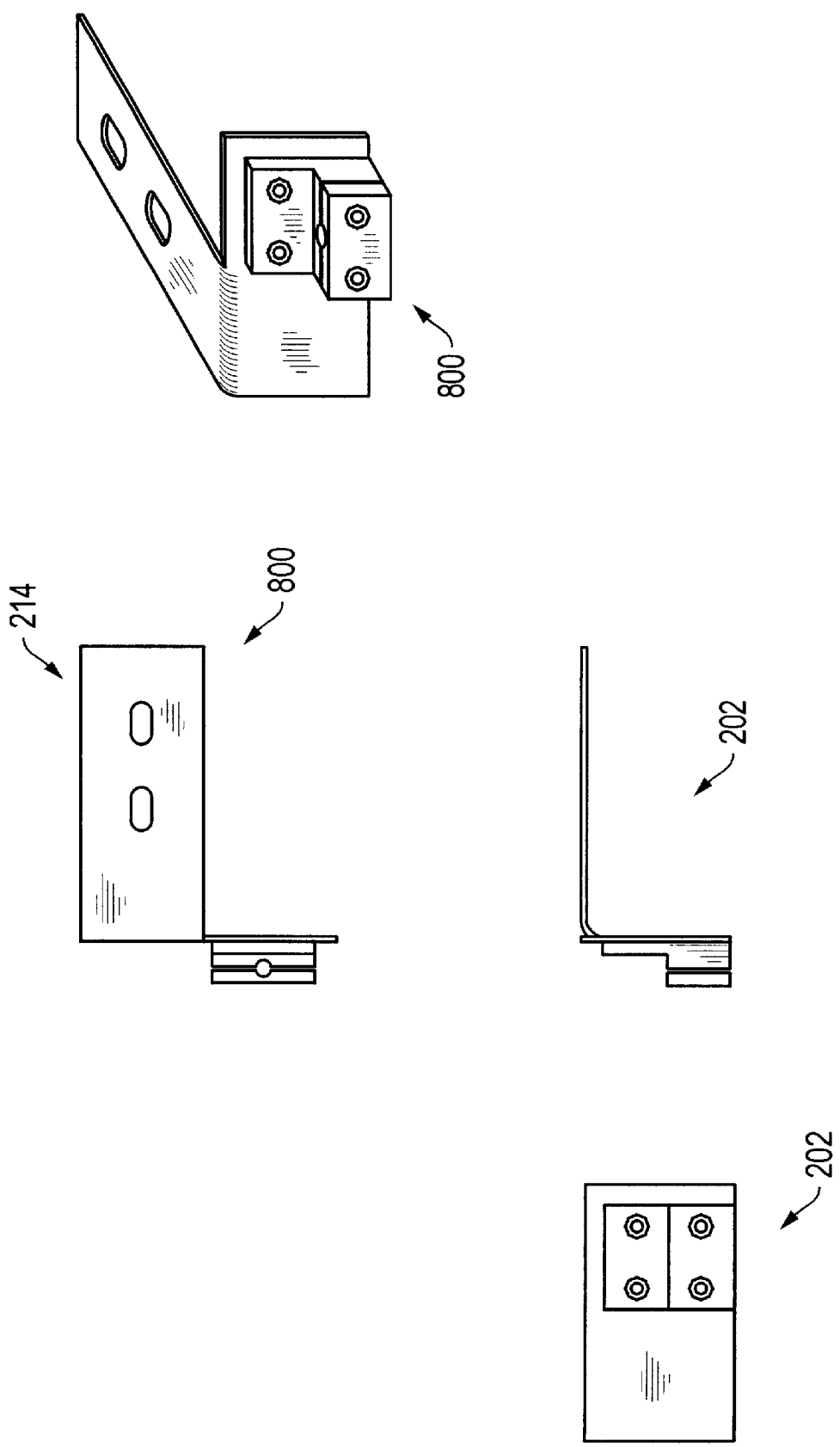
FIG. 8 shows various views of solvent dispensing nozzle bracket assembly 800 consisting of solvent dispensing nozzle block 202 and solvent dispensing nozzle bracket 200.

In the absence of the present embodiment, the Dainippon Screen 623 coater(again, which is merely exemplary of coating machines generally) has neither solvent dispensing nozzle 300 (not visible in FIG. 2 due to the angle of viewing; see FIG. 3) nor solvent dispensing nozzle bracket 200, nor solvent dispensing nozzle block 202 (which collectively can be referred to as a "bracket assembly," such as is illustrated in FIG. 8, below) nor solvent dispensing line 204. Accordingly, in order for the inventor to equip the Dainippon Screen 623 coater with the ability to dispense solvent, it was necessary to design a bracket assembly, composed of solvent dispensing nozzle bracket 200 and solvent dispensing nozzle block 202, capable of holding and correctly positioning solvent dispense line 204 and solvent dispensing nozzle 300 (see FIG. 3) so that centering of solvent dispensing nozzle 300 (see FIG. 3) in three dimensions could be achieved. As will be discussed subsequently, solvent dispensing nozzle bracket 200 allows for movement of a solvent dispensing nozzle in two dimensions x and y (roughly equating (but not exactly equating, due to the perspective view of FIG. 2) equating to the horizontal and vertical dimensions of FIG. 2, respectively; in other words, if the Dainippon Screen 623 coater was sitting on a factory floor, solvent dispensing nozzle bracket 200 would allow movement in the x-y plane horizontal to the factory floor), while solvent dispensing nozzle block 204 allows for motion in a third dimension z (roughly equating to the dimension in and out of the paper containing FIG. 2; in other words, if the Dainippon Screen 623 coater was sitting on a factory floor, solvent dispensing nozzle block 204 would allow movement in the z direction perpendicular to the factory floor). During operation of the system shown in FIG. 2, typically there would be a semiconductor wafer (not shown) located on wafer holder 210 internal to cup 212, and arm 214 would be positioned such that solvent dispensing nozzle 300 (see FIG. 3) is positioned roughly in the center of the semiconductor wafer. This configuration is illustrated in FIG. 3.

Figure 3:
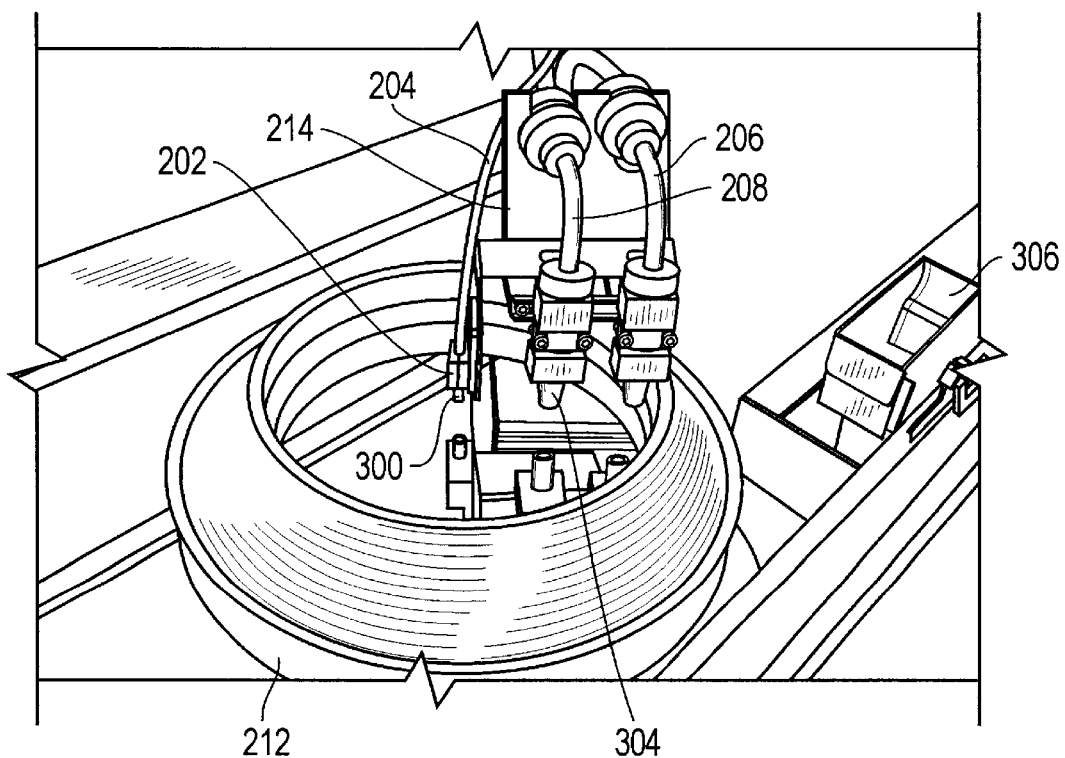
FIG. 3 illustrates that arm 214 has been positioned such that solvent dispensing nozzle 300 is roughly centered over semiconductor wafer 302 residing upon wafer holder 210 internal to cup 212.

With reference now to FIG. 3, illustrated is that arm 214 has been positioned such that solvent dispensing nozzle 300 is roughly centered over semiconductor wafer 302 residing upon wafer holder 210 internal to cup 212. Note that semiconductor wafer 302 appears "mirror like" due to its highly polished nature, and thus also gives a good view of what the underside of solvent dispensing nozzle block 202 and solvent dispensing nozzle 300 look like.

Shown is Polyimide dispensing nozzle 304 which is mounted on arm 214. In one embodiment, the Dainippon Screen 623 coater has a number of preset locations (e.g., four locations) wherein arm 214 can be located. Shown is that solvent dispensing nozzle block 202 and solvent dispensing nozzle bracket 204 are mounted on arm 214 such that in at least one of such preset locations solvent nozzle 300 can be adjusted in 3-dimensions such that solvent nozzle 300 can be positioned such that Polyimide solvent (e.g., NMP) can be dispensed as near to the center of semiconductor wafer 302 as is practicable (in one embodiment dispensing the Polyimide solvent near the center of the semiconductor wafer allows for relatively good coverage of the wafer with the solvent). Those skilled in the art will recognize that there are some machines which have arms, analogous to arm 214, which can be more or less placed at any position over a semiconductor wafer; in an embodiment with such a continuously adjustable arm the nozzle assembly is designed such that it allows centering over the wafer when at a predefined position of the continuously adjustable arm.

Continuing to refer to FIGS. 2 and 3, in one embodiment solvent dispensing nozzle bracket 200 is designed to move in an x-direction of a horizontal plane parallel with a factory floor upon which the Dainippon screen is sitting, with implementations allowing range of motion from ½ inch to 1 inch, but which in other embodiments could allow more or less motion. In one embodiment, solvent dispensing nozzle block 202 consists of two main parts held together by bolts (see FIG. 9), where the two main parts squeeze between them solvent dispensing line 204 (which is in one embodiment a Teflon line); in one embodiment, movement of solvent dispensing nozzle 300 in the vertical direction z relative to the defined x-y horizontal plane horizontal to the factory floor is achieved by loosening the bolts and moving the solvent dispensing nozzle 300 towards wafer holder 210 or away from wafer holder 210.

Referring now again to FIG. 3, shown is solvent drain 306. In one embodiment, solvent drain 306 is used to catch any inadvertently discharged solvent from solvent dispensing nozzle 300 when arm 214 is moved into an inactive, or home, position over solvent drain 306.

Figure 4:
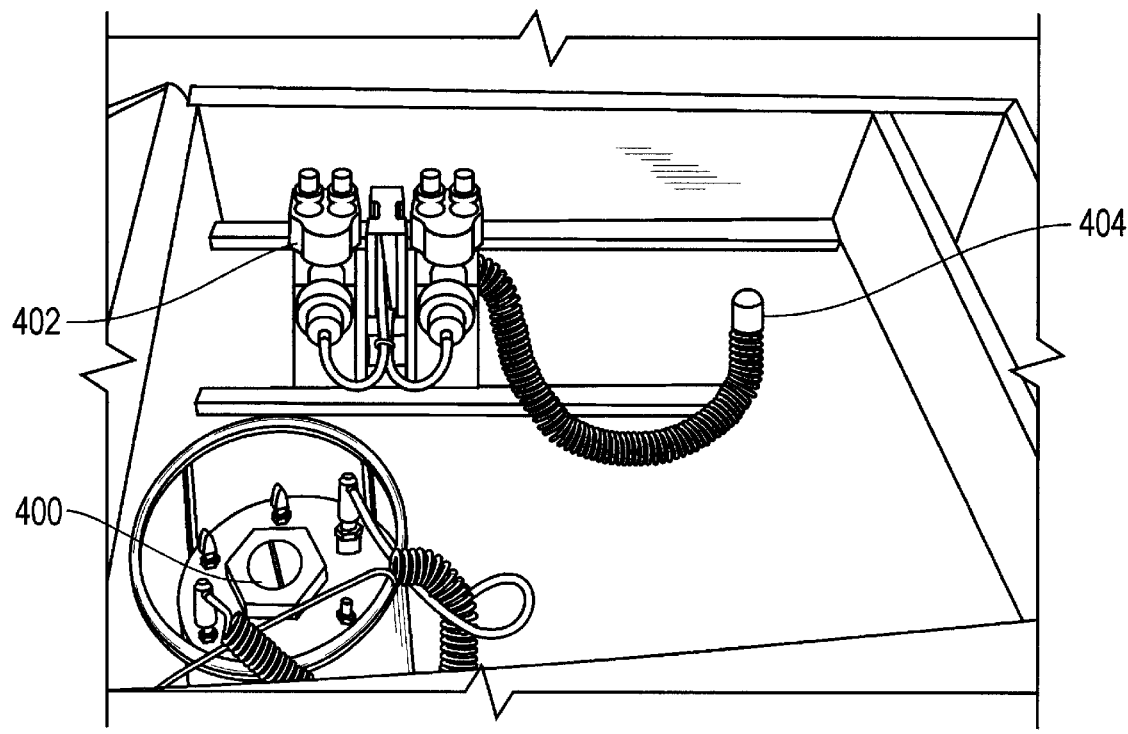
FIG. 4 shows a perspective view of an embodiment of a solvent chemical supply system as implemented on a Dainippon Screen 623 coater.

Referring now to FIG. 4, shown is a perspective view of an embodiment of a solvent chemical supply system as implemented on a Dainippon Screen 623 coater. In one embodiment, an unused chemical backrinse subsystem of the Dainippon Screen 623 coater was used as the solvent chemical supply system in order to save on costs. However, those skilled in the art will recognize that other embodiments can be achieved basically by purchasing and installing the parts necessary to duplicate the functions of the chemical backrinse subsystem, as described herein. (Those skilled in the art will recognize that "backrinse" is an operation wherein a chemical is sprayed on the backside of a semiconductor wafer to prevent the coating from wrapping around or getting on the backside of the wafer.) Consequently, the unused backrinse subsystem has all the parts ordinarily utilized (chemical reservoir, pressurization, and associated controlling apparati) to dispense a chemical, which makes it attractive for use as part of a solvent dispensing system.

Depicted is NMP pressure canister 400 (in one embodiment, the solvent dispensed is a Polyimide solvent N-Methly Pyrrolidine, referred to herein as "NMP"). In one embodiment, NMP pressure canister 400 is an 18 liter pressure canister. Illustrated is that NMP pressure canister 400 is pressurizing or filling NMP trap tank 402. The function of NMP trap tank 402 (which in one embodiment is an existing trap tank associated with an existing backrinse subsystem)is that NMP trap tank 402 senses for a chemical empty condition (and is hence used in one embodiment to give an alarm that NMP pressure canister 400 is empty).

Illustrated is that NMP trap tank 402 feeds into existing filter housing having NMP Filter 404. Even though NMP is typically semi-conductor grade, in at least one embodiment the NMP is still filtered because when connections are made to NMP pressure canister 400 (such as when a new canister is added to introduce more NMP into the system when NMP trap tank 402 indicates an empty condition is present), sometimes impurities are introduced into the chemical stream. Once again, although one embodiment uses an existing unused backrinse system of the Dainippon Screen 623 coater to save costs, in other embodiments a system similar to that depicted in FIG. 4 could be achieved with an add-on system constructed from add-on parts.

Figure 5:
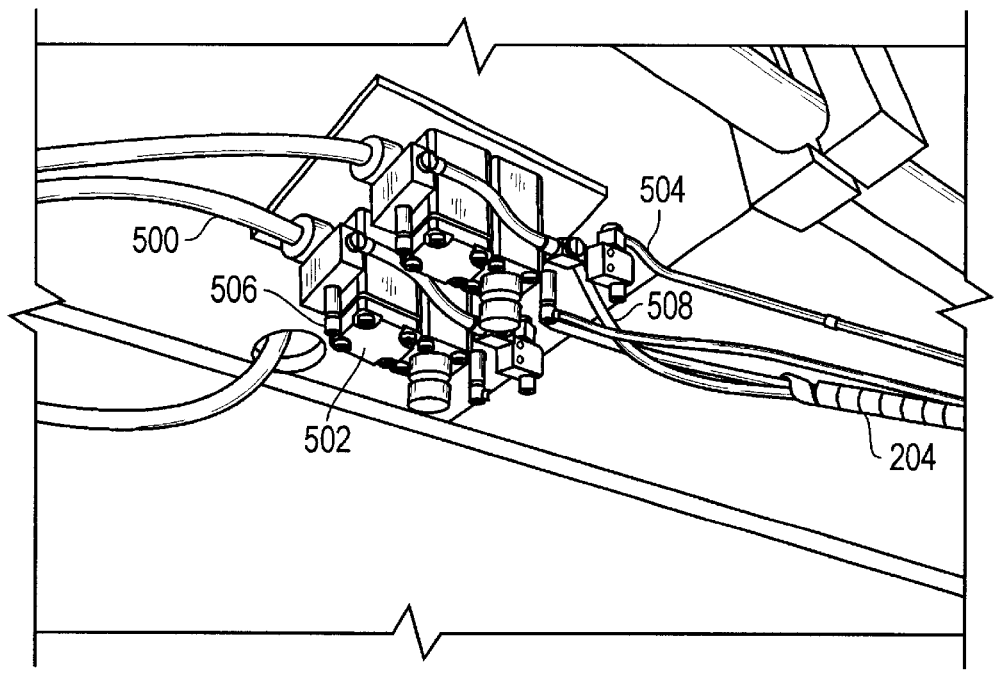
FIG. 5 illustrates a perspective view of the underside of the portion of the Dainippon Screen 623 which underlies the portion of arm 214 of FIG. 2 and 3 where solvent dispensing line 204 passes internal to the Dainippon Screen 623 coater.

With reference now to FIG. 5, depicted is a perspective view of the underside of the portion of the Dainippon Screen 623 which underlies the portion of arm 214 of FIGS. 2 and 3 where solvent dispensing line 204 passes internal to the Dainippon Screen 623 coater. Illustrated are NMP Supply Line 500 and NMP Dispense/suckback Valve 502. In one embodiment, NMP supply line 500 is a Teflon line connected with NMP filter 404 of FIG. 4, as can be seen on the piping diagram of FIG. 6, described below.

In one embodiment, NMP supply line 500 is pressurized with NMP. To control the dispense of the pressurized NMP, in one embodiment Dispense/suckback valve 502 is opened and closed in order to allow the chemical to flow out through solvent dispensing nozzle 300. In one embodiment, Dispense/suckback valve 502 is an air operated Teflon diaphragm valve made by CKD actually (the exact part number of the valve used appears in FIG. 7, which depicts a part list, below). Those skilled in the art will recognize that the valve called out in the parts list is widely used in the semiconductor industry and is a very reliable valve and is often used for dispensing purposes.

In one embodiment, a bracket holds dispense/suckback valve 502. That bracket, locationwise, is approximately just underneath cup 212 depicted in FIGS. 2 and 3. It should be noted in one embodiment, it is desired to have dispense/suckback valve 502 located as close as is practicable to the point of dispense, in order to increase the chances of acceptable suckback. Those skilled in the art will recognize that "suckback" is a term generally used to describe the process of "sucking back" on whatever chemical is being dispensed onto a wafer, so that subsequent to dispensing unwanted chemical does not drip onto the wafer. So to help prevent such inadvertent dripping, valves such as dispense/suckback valve 502 are designed with suckback capability; that is, once such valves are finished dispensing, they are designed such that the valves pull the liquid dispensed by the valve back up the line. It should be noted in one embodiment, the proper suckback valve parameters were determined via trail and error in order to get the suckback behavior to be very repeatable and robust. In one embodiment, it was found that if gentle suckback was not used, the system would sometimes drip. It should be noted that suckback parameters are very dependent on the characteristic on the fluid, temperature and how often it's the system is running; consequently, the industry standard practice for determining appropriate suckback parameters is via the empirical process described.

Referring now to FIG. 5, in one embodiment suckback parameters were adjusted via speed controllers, such as speed controller 506 associated with NMP dispense/suckback valve 502. Speed controllers, such as speed controller 506, control how fast the NMP dispense/suckback valve opens and closes.

Further depicted in FIG. 5 are pneumatic line 504 and associated speed controller 508 for dispense/suckback valve 502, which control the opening and closing of NMP dispense/suckback valve 502 via the application of air pressure in pneumatic line 504. What controls the air pressure in pneumatic line 504 is existing logic on the Dainippon Screen 623 associated with the unused backrinse system. In one embodiment, the foregoing described logic consists of using a signal which controls the supply of air to a solenoid valve that opens up an AOV (air operated valve), which is used in the backflow system, converted to function as a Polyimide solvent dispense system, to effect the pressure in pneumatic line 504, which is used to control dispense/suckback valve 502. Consequently specification of backflow in rows C2 in the recipes (programming used to control the Dainippon Screen 623 coater), the signal drives the AOV open which causes the dispense/suckback valve 502 to activate; the recipes are described below in relation to FIGS. 12 and 13). That is, in the recipes described below, when a command is given to dispense backflow, the Dainippon Screen 623 coater machine thinks it's dispensing backflow, but it's actually opening dispense/suckback valve 502 thereby effecting control of the starting and stopping of the dispensing associated with dispense/suckback valve 502.

Figure 6:
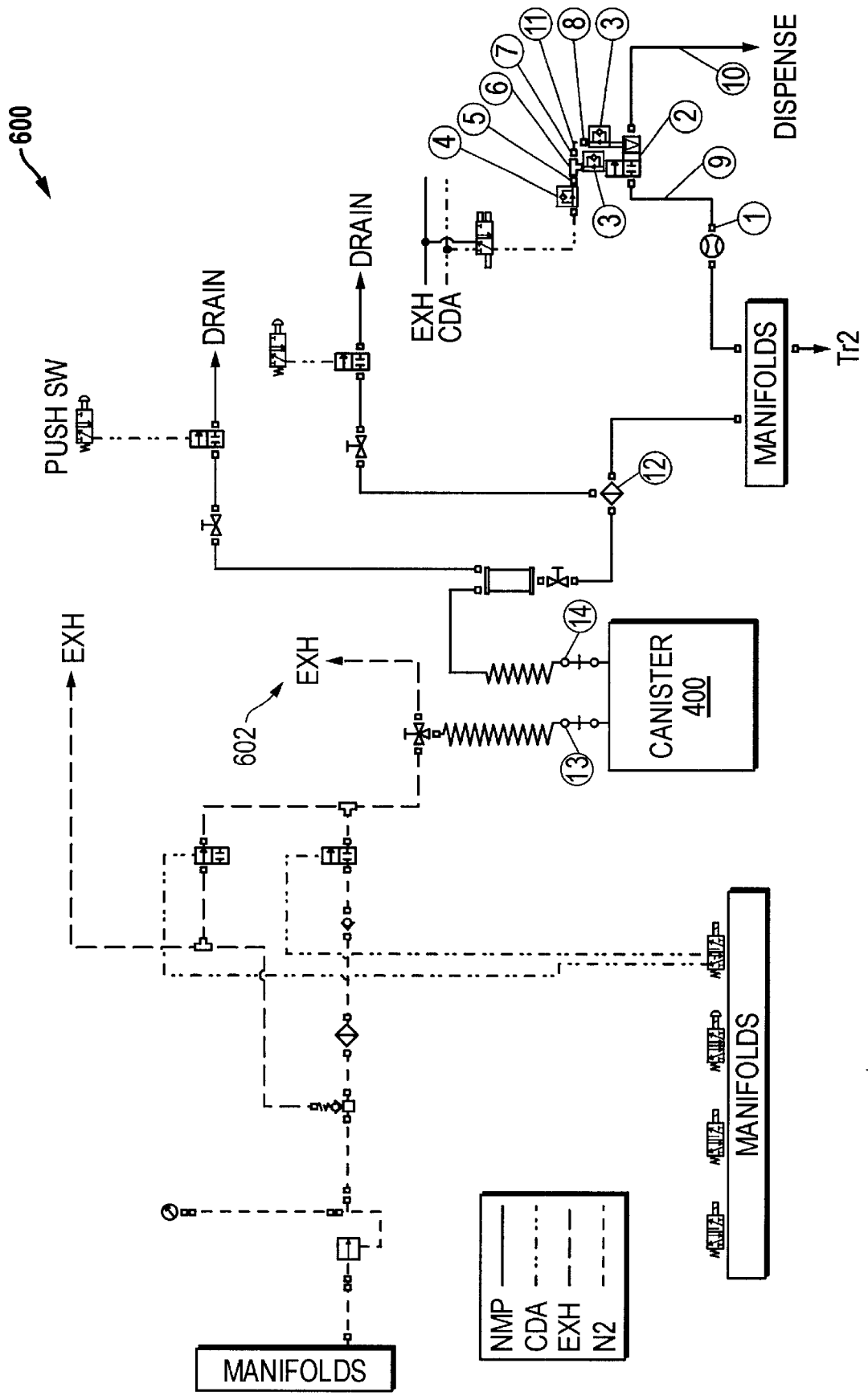
FIG. 6 illustrates piping diagram 600 of the embodiments described above in relation to FIGS. 1–5.

With reference now to FIG. 6 illustrated is piping diagram 600 of the embodiments described above in relation to FIGS. 1–5. Where applicable, reference numerals have been utilized to coordinate the parts of the piping diagram with their counterparts in FIGS. 1–5. The other numbers present in FIG. 6 coordinate with the parts list shown on FIG. 7. In general, parts not labeled in FIG. 6 and/or appearing in FIG. 7 are existing parts on the Dainippon Screen 623 coater (e.g., NMP trap tank 402). Piping diagram 600 shows the pneumatic (air) piping and how the air piping system is controlled, and shows the liquid piping system and how the liquid piping system is controlled. Note that on the very far right lower corner of FIG. 6, the arrow labeled "dispense" represents solvent dispensing nozzle 300.

FIG. 6 uses different colors and different patterned lines to indicate the presence of different substances in the pneumatic and liquid tubing. For example, shown in the legend at the bottom of FIG. 6 is that the blue short-dashed lines in the piping diagram are representative of tubing carrying N2 (Nitrogen); the green long-dashed lines are representative of tubing carrying exhaust gas; the red alternating long dash-short double-dash lines are representative of tubing carrying CDA (Clean Dry Air); and the solid black lines are representative of tubing carrying Polyimide solvent (NMP). It should be noted that some of the discrete parts in the tubing diagram are drawn in solid black lines for practicality reasons, although the context generally makes apparent what lines are indicative of tubing and what lines are merely used to draw, or outline, parts in the figure (e.g., NMP pressure canister 400 is drawn with solid black lines).

Shown in FIG. 6 are notations indicative of inner and outer tubing sizes. For example, the exhaust line 602 near the center of FIG. 6 is denoted as being of size phi 8/phi 6. This notation—phi outer diameter/phi inner diameter—is intended to indicate that the tubing depicted has an 8 millimeter outside diameter, and a 6 millimeter inside diameter line. Other such notations used in FIG. 6 should be likewise interpreted. Those skilled in the art will recognize that the phi "outer diameter"/phi "inner diameter " is often used in the art. With respect to the symbols used in FIG. 6, those skilled in the art will recognize that such symbols are of the type ordinarily used in the art for representing components such as filters, speed controllers, valves, etc.

With reference now to FIG. 7, shown is a parts list associated with numbered items in FIG. 6. Depicted are the manufacturer of each one of the listed parts, the price that was paid for each part, and the manufacture's part number associated with each of the parts.

Referring now to FIG. 8, shown are various views of solvent dispensing nozzle bracket assembly 800 consisting of solvent dispensing nozzle block 202 and solvent dispensing nozzle bracket 200. Shown to the far right of the FIG. 8 is a first isometric drawing, in perspective view, of solvent dispensing nozzle bracket assembly 800. Depicted toward the upper center of FIG. 8 is a second isometric drawing, in a first plan view, of solvent dispensing nozzle bracket assembly 800. Illustrated toward the lower center of FIG. 8 is a third isometric drawing, in a second plan view, of solvent dispensing nozzle bracket assembly 800. Shown toward the lower left of FIG. 8 is an isometric drawing, in a plan view, of front and back portions of solvent dispensing nozzle block 202. Further illustrated in the second isometric drawing of FIG. 8 is how solvent dispensing nozzle bracket assembly 800 is positioned, in one embodiment on arm 214 of the Dainippon Screen 623 (arm 214 is illustrated in FIGS. 2 and 3).

Figure 9:
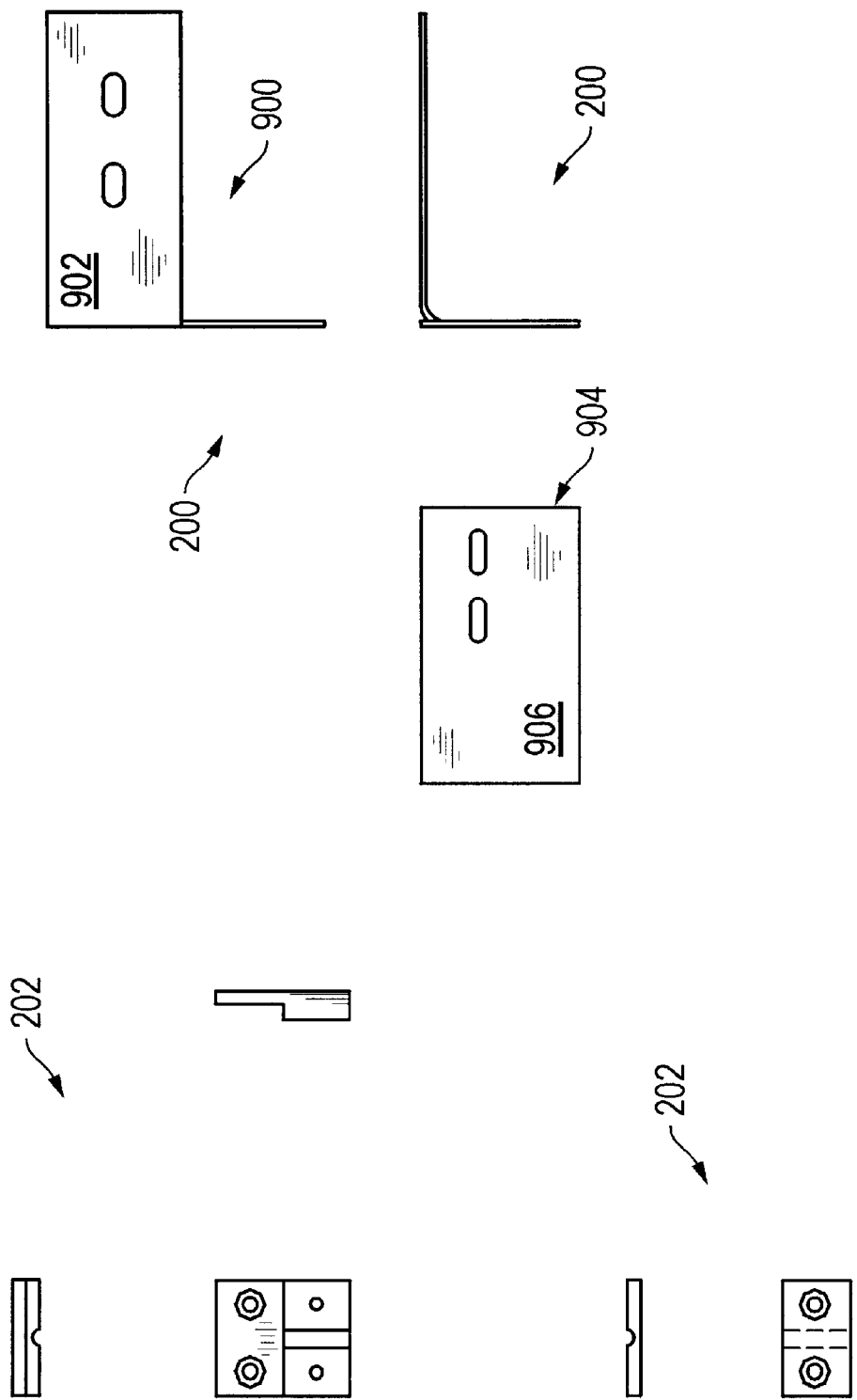
FIG. 9 illustrates a manufacturing drawing for an embodiment of solvent dispensing nozzle bracket 200 and solvent dispensing nozzle block 202.

With reference now to FIG. 9, depicted is a manufacturing drawing for an embodiment of solvent dispensing nozzle bracket 200 and solvent dispensing nozzle block 202. Illustrated in the upper-left-hand quadrant of FIG. 9 are manufacturing drawings of components of solvent dispensing nozzle block 202. The function of solvent dispensing nozzle block 202 is to allow the positioning of solvent dispensing nozzle 300 and also to allow solvent dispensing nozzle 300 of FIG. 3 to be adjusted in what was referred to above as the Z axis in the discussions of FIGS. 2 and 3, which equates to moving solvent dispensing nozzle toward or away from semiconductor wafer 302 depicted in FIG. 3. Solvent dispensing nozzle block 202 as depicted in FIG. 9 can be adjusted to allow the squeezing of solvent dispensing line 204 (which in one embodiment is a Teflon line); adjustment of the depicted two bolts of solvent dispensing nozzle block 202 allows for the sliding of solvent dispense line 204, and hence solvent dispensing nozzle 300, up and down in relation to the nozzle block assembly 800.

Continuing to refer to FIG. 9, in the upper right-hand quadrant of FIG. 9 is a manufacturing drawing the portion of solvent dispensing nozzle bracket 200 which allows motion in the X-axis direction as described in relation to FIGS. 2 and 3. In the upper-right-hand quadrant of FIG. 9 are shown slotted orifices 900—formed in the portion 902 of solvent dispensing nozzle bracket 200 which lies flat in the x axis-z-axis—through which bolts (not shown) are extended which allows solvent dispensing nozzle bracket to be adjusted in what was described as the X axis in FIG. 2.

Continuing to refer to FIG. 9, in the lower-right-hand quadrant of FIG. 9 is a manufacturing drawing of the portion of solvent dispensing nozzle bracket 200 which allows motion in the Y-axis direction as described in relation to FIG. 2. In the lower-right-hand quadrant of FIG. 9 shown are slotted orifices 904—formed in the portion 906 of solvent dispensing nozzle bracket 200 which lies flat in the y-axis-z-axis plane—through which bolts (not shown) are extended which allows solvent dispensing nozzle bracket to be adjusted in what was described as the Y-axis in FIG. 2.

It should be re-iterated here that the axes discussed are in relation to the figures above (e.g., FIGS. 2 and 3), and are meant to imply that if the machine in FIG. 2 were viewed as sitting on a factory floor, the x-y axis directions would refer to direction parallel to the factory floor, while the z-axis direction would refer to a direction perpendicular to the factory floor.

Referring now to FIG. 10, shown is a drawing of a NMP pre-wet valve mounting bracket manufacturing drawing. This bracket is shown in FIG. 5, and is the bracket holding the two depicted dispense/suckback valves (e.g. dispense/suckback valve 502) on the Dainippon Screen 623 coater machine. (Those skilled in the art will recognize that the Dainippon Screen 623 coater machine is constructed such that it has two substantially identical "tracks," each of which is capable of dispensing Polyimide; hence, in one embodiment the systems and processes described herein, there is also a duplicate Polyimide solvent dispense system for the duplicate track. However, only one track is discussed herein for sake of clarity; that is, two dispense suckback valves appear in FIG. 5 since there is a substantially identical assembly on the Dainippon Screen 623 coater machine just to the left of the one that's depicted and described in relation to that shown in FIGS. 2–4 which in most substantial aspects is a duplicate of the system described herein.)

With respect to the placement of the bracket shown in FIG. 10, in relation to the Dainippon Screen 623 coater machine, the location chosen for placement is proximately underneath the cups associated with each dispense/suckback valve shown in FIG. 5 (remember two cups are present to support the two tracks, but only one has been illustrated herein for sake of clarity).

With reference now to FIG. 11, depicted is a manufacturing drawing for solvent drain 306 illustrated and described in relation to FIG. 3. The function of solvent drain 306 is to capture solvent from solvent dispensing nozzle 300 if an accident occurs wherein solvent dispensing nozzle 300 is not in use (e.g., a valve fails, someone actuates the dispense valve while the nozzle is in the "home" position (i.e., positioned over solvent drain 306). As depicted in FIG. 3 solvent drain 306 is situated such that solvent drain 306 will catch solvent inadvertently discharged from solvent dispensing nozzle 300 and re-direct such inadvertently spilled fluid to a drain of the Dainippon Screen 623 coater machine, rather than allowing such spilled fluid to flow down on the machine, which would happened in the absence of solvent drain 306. Solvent drain 306 is needed existing Dainippon Screen 623 coater machine drain only provides protection for the 2 existing Polyimide nozzles 206, 208 that are on the machine.

The embodiments herein have been discussed in the context of the Dainippon Screen 623 coater machine for clarity. It will be understood in the art that the use of the Dainippon Screen 623 coater machine was merely exemplary, and there are many different systems (e.g., other makes and models which dispense Polyimide) wherein the embodiments described herein would provide useful. In addition, although only the Polyimide process was described herein, the embodiments described herein, with just minor modifications well within the ambit of those having ordinary skill in the art, would prove useful for other coating systems.

II. Processes

Referring now to FIG. 12A, shown are screen prints taken from the Dainippon Screen 623 coater of (1) recipe 1200 containing a recipe which is used to control the dispensing of 1.3 grams of Polyimide from an unmodified Dainippon 623 coater, and (2) recipe 1250 containing a recipe which is used, in one embodiment, with the modified Dainippon Screen 623 system—described above in relation to FIGS. 1–11—in order to control the both the dispensing of the Polyimide solvent (NMP) and the subsequent dispensing of 1.3 grams of Polyimide.

It is to be understood that in the absence of dispensing the Polyimide solvent, the recipe shown in recipe 1200 will generally not yield acceptable semiconductor wafers since the amount of Polyimide dispensed will not adequately cover the wafers. However, in the presence of the Polyimide solvent pre-wet process depicted in recipe 1250, the amount of Polyimide dispensed will yield acceptable semiconductor wafers since in the presence of the Polyimide solvent pre-wetting the amount of Polyimide dispensed will adequately cover a semiconductor wafer. Recipes 1200 and 1250 are shown in juxtaposition in order to highlight the benefits associated with the Polyimide solvent (e.g., NMP) pre-wet sequence.

With reference now to FIG. 12B, shown is key 1204, which explains to what the various entries in recipes 1200 and 1250 refer. In addition, key 1204 also is to be used with, and explains to what the various entries in recipes 1300 and 1350 appearing in FIG. 13 refer.

Recipes 1200 and 1250 are arranged such that each column of their respective first rows represents discrete steps in the recipe (except for the first column, which tells what the column entries of the row describe—e.g., "step N," where N is 1, 2, 3, . . . 8 for row 1, spin rate for row two, times T1 and T2 in rows 3 and 4, etc.). The respective second rows, each denoted "SPIN N," of recipes 1200 and 1250 are arranged such that each column represents the spin rate, in revolutions per minute (RPM) of a semiconductor wafer for each correspondent recipe step N in such recipes (e.g., recipe 1200 and 1250) respective first rows. Due to an idiosyncrasy of the Dainippon Screen 623 coater user interface, it is to be understood that in order to get the true RPM from the values depicted, the values depicted should be multiplied by 10; e.g., for recipe 1200, its step 4's RPM would be indicative of 175×10=1750 RPM, recipe 1200, its step 7's RPM would be indicative of 500×10=5000 RPM). The respective third rows, each denoted "T1," of recipes 1200 and 1250 are arranged such that each column represents the time in seconds during which transition from the previous step's to the current step's rate of rotation (RPM) should occur (e.g., for recipe 1200, in step 3, the rate of rotation should accelerate from 0 (rate of rotation in step 2 of recipe 1200) to 500 RPM (rate of rotation specified in step 3 of recipe 1200) in 0.5 seconds). The respective fourth rows, each denoted "T2," of recipes 1200 and 1250 are arranged such that each column specifies the total time in seconds for the duration of the defined rate of rotation of the step N (e.g., step 3 of recipe 1200 should last a total time of 15.5 seconds, which gives 15.0 seconds of spin rate 500 RPM and 0.5 seconds for the system to ramp up from 0 RPM to 500 RPM; likewise, step 3 of recipe 1250 should last a total time of 1.0, which gives 1.0 seconds of spin rate 200 RPM and ramp-up time is 0.0 seconds). That is, the total time involved for each step N is T1+T2.

The respective seventh through fourteenth rows, "C1 through C8," of recipes 1200 and 1250 are representative of "chemical" (again, those skilled in the art will recognize that "chemical" generally means something used in a process, and thus can mean an actual chemical, such as NMP or Polyimide, or can mean vacuum, or can mean "back blow," etc.) dispensement systems on the Dainippon Screen 623 coater, many of which have reservoirs which can be loaded with chemicals and then dispensed. With respect to the rows "C1" through "C8" of recipes 1200 and 1250, the presence or absence of a number in such rows indicates a chemical being dispensed from such a system. For example, referring to recipe 1250, in row 8 of the table—denoted "C2"—and the column denoted "step 5" the number "1" is present;

referring to key 1204, it can be seen that the number "1" equates to the chemical "Polyimide," so the presence of "1" in the column denoted "step 5" of the row denoted "C2" is interpreted to mean that the chemical Polyimide is dispensed (e.g., through Polyimide dispense nozzle 304) for the duration of step 5 (e.g., 7.5 seconds). As further examples, continuing to refer to recipe 1250, note that in steps 6 and 7 of the row denoted "C2," the number "8" is present; referring to key 1204, it can be seen that the number "8" equates to the "chemical" consisting of the operation of "exhaust damper closed" (again, those skilled in the art will recognize that it is common to refer to even operations such as the foregoing as "chemicals"), where such "chemical" is "dispensed" for the duration of steps 6 and 7 of recipe 1250).

The respective fifteenth rows, denoted as "M1," of recipes 1200 and 1250 are representative of positioning of Polyimide dispensing nozzle 304 which is mounted on arm 214 associated with a track (or separate subsystem capable of manipulating and operating on a semiconductor wafer). For example, there are two tracks on the Dainippon Screen 623 coater, each track having an arm, Polyimide dispense nozzle, a series of chemical dispensing system, etc., and thus in order to correctly specify a recipe, it is necessary to tell the Dainippon Screen 623 Coater which track (and hence which set of nozzles) to use for operations specified in the columns (which equate to process steps) of recipes. Hence, it is to be understood that essentially all the process steps described herein would be duplicated for the second track of the Dainippon Screen. For ease of understanding all recipes herein refer to track 1, although it is to be understood that such recipes could apply equally well to track 2.

The respective sixteenth and seventeenth rows, denoted "P1x" and "P1y," specify an x-y position of Polyimide dispensing nozzle 304 which is mounted on arm 214 (and hence the position of solvent dispensing nozzle 300, since Polyimide dispensing nozzle 304 and solvent dispensing nozzle 300 are disposed on arm 214 in the fashion illustrated in FIG. 3 and other figures herein) in the pre-defined coordinate system of the Dainippon Screen 623 machine (where the x-y positions are roughly equivalent to positions along the x-axis and y-axis discussed above in relation to FIGS. 1–11). In one embodiment (e.g., that shown in FIG. 3, above), solvent dispensing nozzle 300 and Polyimide dispensing nozzle 304 are at roughly the same y-axis location but are separated by roughly 36 millimeters in the x-axis direction (where the x-y positions are roughly equivalent to positions along the x-axis and y-axis discussed above in relation to FIGS. 1–11). However, it is to be understood that the foregoing described relative positioning will vary from machine to machine, but that the intent of the relative positioning is to get the separation of solvent dispensing nozzle 300 and Polyimide dispensing nozzle 304 such that solvent dispensing nozzle 300 can be substantially centered over the wafer at the appropriate steps in the recipes described below) The remaining meaning of rows not specifically discussed herein are indicated in key 1204.

Continuing to refer to FIG. 12A, with respect to recipe 1250, it can be seen that steps 1–4 constitute the Polyimide solvent (e.g., NMP) dispense pre-wetting sequence. Step 1 describes accelerating a semiconductor wafer—associated with a solvent dispensing nozzle (e.g., solvent dispensing nozzle 300) associated with a Polyimide dispensing nozzle 304 (M1=1) of arm 214 positioned at location [P1x=2, P1y=0]— from 0 to 2000 RPM in 0.5 seconds (T1), and thereafter holding the spin rate at 2000 RPM for 2.0 seconds, for a total of 20.5 seconds (T2). Step 2 describes dispensing a Polyimide solvent, NMP (C2)—through a solvent dispensing nozzle associated with a Polyimide dispensing nozzle 304 (M1=1) of arm 214 positioned at location [P1x=2, P1y=0] (which equates to substantially the center of a semiconductor wafer in one embodiment)—for 2.0 seconds (in one embodiment, this equates to dispensing 2 ml of Polyimide Solvent NMP), during which the spin rate is held constant at 2000 RPM. Step 3 describes moving a nozzle associated with a Polyimide dispensing nozzle 304 (M1=1) of arm 214 to location [P1x=3, P1y=0], while continuing to spin the semiconductor wafer at 2000 RPM for 1.0 second. Step 4 describes continuing to spin the semiconductor wafer at 2000 RPM for another 40.5 seconds; it will be noted that there is a "ramp up" time of 0.5 seconds dictated for step 4, even though the semiconductor is to be continued to rotate at a constant speed of 2000 RPM—the reason for such ramp-up time is an idiosyncrasy of the Dainippon Screen 623, in that if the 0.5 second ramp up time is not inserted sometimes (but not always) an error condition will develop with the Dainippon screen in going from step 4 to step 5. In general any such ramp-up times shown herein wherein the spin rate is shown to be constant is present to correct for this noted idiosyncrasy.

Continuing to refer to recipe 1250, it can be seen that step 5 is substantially similar to step 1 of recipe 1250, wherein Polyimide (chemical "1" in key 1204) is dispensed onto the semiconductor wafer held stationary (denoted by spin rate 0 RPM in row SPIN N) through the Polyimide dispensing nozzle 304 (M1=1) of arm 213 (denoted by the presence of a "1," in row C2, which key 1204 indicates is associated with Polyimide dispense). Thereafter, the remaining steps of recipe 1250 denote, via the specific operations listed in each step, the operations necessary to spin the semiconductor wafer such that the Polyimide spreads out and covers the semiconductor wafer.

Comparison of step 5 of recipe 1250 and step 1 of recipe 1200 shows that such steps are substantially the same, and they should be in that, as mentioned at the outset, both recipes describe dispensing 1.3 grams of Polyimide. However, comparison of the remaining set of steps 6–11 of recipe 1250 with the analogously functioning set of steps 2–8 of recipe 1200 show that, in general the subsequent energy employed in an effort to spread the Polyimide over the semiconductor wafer is generally less in recipe 1250 than that required in recipe 1200.

The foregoing discussion has mainly focused on recipes 1200 and 1250 marked as describing dispensing 1.3 grams of Polyimide. In the 1.3 grams version of the Polyimide Solvent Pre-Wet/Polyimide dispense, the dispensing and spreading of the 2 ml of NMP via steps 1–4 results in being able to reduce the amount of required Polyimide dispensed in step 5 from 3.0 grams (which was required in the absence of the Polyimide solvent (e.g., NMP) pre-wet in order to obtain acceptable performance/yield from semiconductor wafers) down to 1.3 grams, while still providing performance/yield for semiconductor wafers as good as or better than the use of the 3.0 grams of Polyimide in the absence of the Polyimide solvent. The time of dispense (T2=70.5 seconds) shown in step 5 of the pre-wet recipe 1250 for 1.3 grams of Polyimide is that associated with dispensing as near as practicable to 1.3 grams of Polyimide. Such time could vary depending upon the viscosity of the Polyimide used. In one embodiment, the viscosity of the Polyimide used is around 3500 cps at 35 degrees C., and such Polyimide is available for purchase from the TORAY company having offices in Japan, among other places. However, those skilled in the art will recognize that the Polyimide viscosity range in the industry is from around 1000 cps to 8000 cps. In addition to the foregoing, as has been explained the recipes 1200 and 1250 depicted are for the Dainippon Screen 623 coater machine. The Dainippon Screen MFG. CO., LTD. has offices in RAKUSAI JAPAN.

With reference now to FIG. 13, shown are screen prints taken from the Dainippon Screen 623 coater of (1) recipe 1300 containing a recipe which is used to control the dispensing of 1.15 grams of Polyimide from an unmodified Dainippon 623 coater machine, and (2) recipe 1350 containing a recipe which is used, in one embodiment, with the modified Dainippon 623 coater machine system—described above in relation to FIGS. 1–11—in order to control the both the dispensing of the Polyimide solvent (NMP) and the subsequent dispensing of 1.15 grams of Polyimide.

Respectively comparing recipe 1300 with recipe 1200, and respectively comparing recipe 1350 with 1250, yields the determination that the 1.3 gram recipes (recipes 1200 and 1250) are substantially similar to the 1.15 gram recipes (1300 and 1350), except for the fact that the Polyimide dispense steps (step 1 in recipes 1200 and 1300, and step 5 in recipes 1250 and 1350), vary. Specifically, times of dispense in the FIG. 13 recipes 1300 and 1350, denoted as row "T2," equals 5.5 second, while in the FIG. 12 recipes such times of dispense, denoted as row "T2," equal 70.5 seconds.

In addition to the foregoing, insofar as the 1.15 grams Polyimide recipes (1300 and 1350) and 1.3 grams Polyimide recipes (1200 and 1250) have common entries, the discussion of the 1.3 gram Polyimide recipes likewise applies to the 1.15 grams Polyimide recipes. For example, in the 1.15 grams version of the Polyimide pre-wet/Polyimide dispense process (i.e., recipe 1350), the dispensing of the 2 ml of Polyimide Solvent (e.g., NMP) results in being able to reduce the Polyimide dispensed down to 1.15 grams, while still providing performance/yield for semiconductor wafers as good as or better than the use of the 3.0 grams of Polyimide typically used in the absence of the Polyimide solvent. With respect to the time of dispense (T2=5.5 seconds) shown in FIG. 1350 associated with dispensing the 1.15 grams of Polyimide, such time was empirically determined on a trial and error basis. It is to be understood that the time of dispense (e.g., T2=5.5 seconds) shown in step 5 of the pre-wet recipe for 1.15 grams of Polyimide is that associated with dispensing as near as practicable to 1.15 grams of Polyimide. Such time could vary depending upon the viscosity of Polyimide used. In one embodiment, the viscosity of the Polyimide used is around 3500 cps at 25 degres C., and such Polyimide is available for purchase from the TORAY company having offices in Japan, among other places. However, those skilled in the art will recognize that the Polyimide viscosity range in the industry is from around 1000 cps to 8000 cps. In addition to the foregoing, as has been explained the recipes depicted are for the Dainippon Screen 623 coater machine. The Dainippon Screen MFG. CO., LTD. has offices in RAKUSAI JAPAN.

Those skilled in the art will recognize that the exact time required to reach the foregoing referenced amounts of Polyimide Solvent (e.g., 2 ml) and Polyimide (e.g., 1.3 grams and 1.15 grams) vary with implementations, viscosities, temperature, and other factors. In addition to the foregoing, those skilled in the art will recognize that the dispense times and/or amounts for Polyimide solvent (e.g., NMP) and/or Polyimide dispensed can be varied under the spirit of the teachings herein in a fashion such that acceptable performance/yield from semiconductor wafers is obtained. Those skilled in the art will recognize that what constitutes acceptable performance/yield is a design choice that will vary from manufacturer to manufacturer and product to product. In addition, in some instances it is possible to tell by visual inspection when a version of the process is not workable; for example, if 1.3 grams of Polyimide is dispensed in the absence of the Polyimide solvent (e.g., NMP) pre-wet (as in recipe 1200), it is often possible to tell by visual inspection that the Polyimide did not completely cover a portion of a semiconductor wafer.

Acceptable performance/yield is a design choice that will vary from manufacturer to manufacturer and product to product. With respect to testing data related to devices and processes described herein, the description herein has referred to acceptable performance and behavior of semiconductor wafers. Those having ordinary skill in the art will recognize that what constitutes acceptable performance/yield is a design choice that will vary from manufacturer to manufacturer and product to product. One set of testing data having what is deemed acceptable performance is depicted in FIG. 14.

Figure 14:
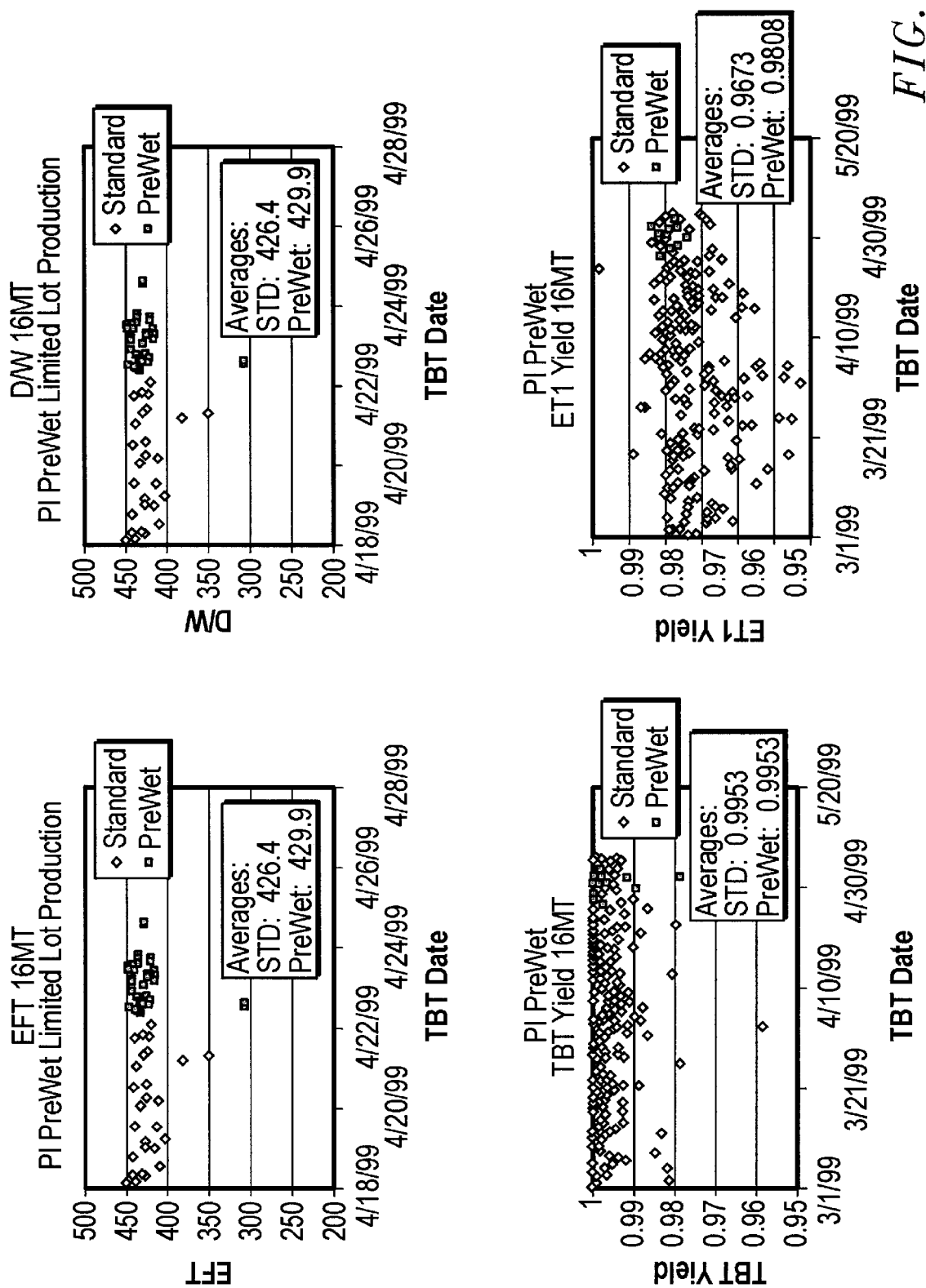
FIG. 14 illustrates one set of testing data showing what is deemed acceptable performance in one embodiment.

Referring now to FIG. 14, illustrated is one set of testing data showing what is deemed acceptable performance in one embodiment. With respect to the testing data drawn from limited lot production for la main memory product of a type often used for testing in that the memory product is so inexpensive as to be considered disposable. With respect to the testing data, "EFT" stands for Easy Functional Test. "Die per wafer" refers to the actual number of final die per wafer, "TBT" stands for a type of "burn in" test, which is a test involving failure under heat cycling. "ET1" is a similar test to TBT, only ET1 is a longer duration (in time) test.

Figure 15:
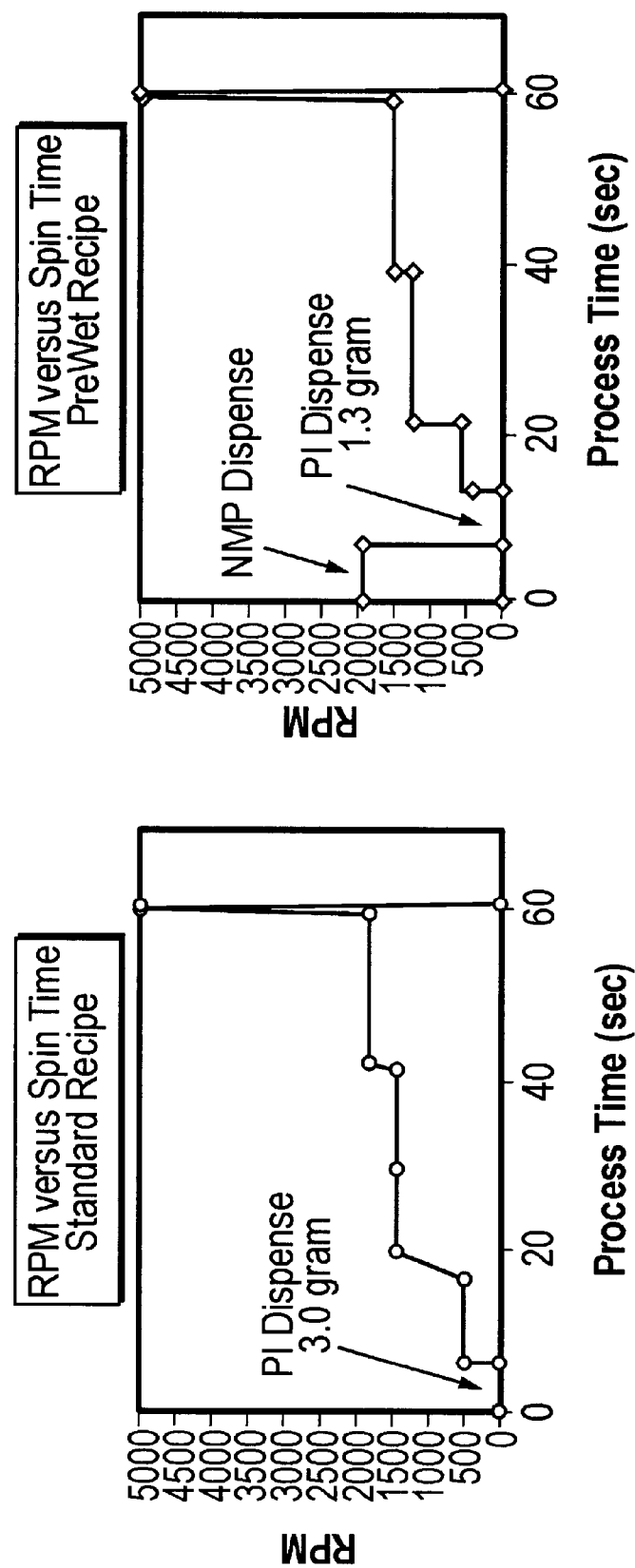
FIG. 15 shows calculations which illustrate some aspects and advantages associated with the 1.3 gram pre-wet recipe described above over the 3.0 grams required for acceptable semiconductor performance/yield in the absence of Polyimide solvent pre-wetting.

With respect to FIG. 15, shown are calculations which illustrate some aspects and advantages associated with the 1.3 gram pre-wet recipe described above over the 3.0 grams required for acceptable semiconductor performance/yield in the absence of Polyimide solvent pre-wetting. Those skilled in the art will recognize that similar calculations can likewise be obtained for the 1.15 gram pre-wet recipe via mathematical operations well within those of ordinary skill in the art (e.g., replacing 1.3 grams with 1.15 grams in the calculations).

Those skilled in the art will recognize that systems such as the Dainippon Screen 623 Coater generally have a great deal of built-in and/or associated computing equipment, where such computer equipment typically includes but is not limited to at least one processor (e.g., main processor, graphics processor, sound processor, etc.), at least one memory (RAM, DRAM, ROM) and at least one communications device (e.g., a network card or modem (optical or electronic)).

The foregoing detailed description has set forth various embodiments of the present invention via the use of block diagrams, flowcharts, and examples. It will be understood as notorious by those within the art that each block diagram component, flowchart step, and operations and/or components illustrated by the use of examples can be implemented, individually and/or collectively, by a wide range of hardware, software, firmware, or any combination thereof. In one embodiment, the present invention may be implemented via the Dainippon Screen 623 Coater machine as discussed above. However, those skilled in the art will recognize that the embodiments disclosed herein, in whole or in part, can be equivalently implemented in logic encoded in Application Specific Integrated Circuits (ASICs), in standard Integrated Circuits, as a computer program running on a computer, as firmware, or as virtually any combination thereof and that designing the circuitry and/or writing the code for the software or firmware would be well within the skill of one of ordinary skill in the art in light of this disclosure. In addition, those skilled in the art will appreciate that the mechanisms of the present invention are capable of being distributed as a program product in a variety of forms, and that an illustrative embodiment of the present invention applies equally regardless of the particular type of signal bearing media used to actually carry out the distribution. Examples of a signal bearing media include but are not limited to the following: recordable type media such as floppy disks, hard disk drives, CD ROMs, digital tape, and transmission type media such as digital and analogue communication links using TDM or IP based communication links (e.g., packet links).

The foregoing described embodiments depict different components contained within, or connected with, different other components. It is to be understood that such depicted architectures are merely exemplary, and that in fact many other architectures can be implemented which achieve the same functionality. In an abstract, but definite, sense any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality.

Other embodiments are within the following claims.

While particular embodiments of the present invention have been shown and described, it will be obvious to those skilled in the art that, based upon the teachings herein, changes and modifications may be made without departing from this invention and its broader aspects and, therefore, the appended claims are to encompass within their scope all such changes and modifications as are within the true spirit and scope of this invention. Furthermore, it is to be understood that the invention is solely defined by the appended claims. It will be understood by those within the art that if a specific number of an introduced claim element is intended, such an intent will be explicitly recited in the claim, and in the absence of such recitation no such intent is present. For example, as an aid to understanding, the following appended claims may contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to inventions containing only one such element, even when the same claim includes the introductory phrases "one or more" or "at least one" and indefinite articles such as "a" or "an"; the same holds true for the use of definite articles used to introduce claim elements. In addition, even if a specific number of an introduced claim element is explicitly recited, those led in the art will recognize that such recitation should typically be interpreted to mean at least the recited number (e.g., the bare recitation of "two elements," without other modifiers, typically means at least two elements, or two or more elements).

What is claimed is:

1. A system, said system comprising:
   a Polyimide solvent dispending nozzle proximate to a Polyimide dispensing nozzle, wherein the Polyimide solvent dispensing nozzle is coupled to a reservoir.

2. The system of claim 1, wherein
   the Polyimide solvent dispending nozzle is coupled with a bracket assembly adjustable in three dimensions.

3. The system of claim 2, wherein said bracket assembly further comprises:
   a bracket adjustable in an x-axis direction.

4. The system of claim 2, wherein said bracket assembly further comprises:
   a bracket adjustable in a y-axis direction.

5. The system of claim 2, wherein said bracket assembly further comprises:
   a bracket adjustable in a z-axis direction.

6. The system of claim 1 further comprising an arm holding the Polyimide dispending nozzle.

7. The system of claim 6, wherein the Polyimide solvent dispensing nozzle is centerable over a wafer holder.

8. The system of claim 1, wherein at least one dispense/suckback valve is interposed between the Polyimide solvent dispensing nozzle and the reservoir.

9. The system of claim 1, wherein at least one air operated valve is operable connected with the Polyimide solvent dispensing nozzle and reservoir.

10. A system for manufacturing semiconductor products, the system comprising:
    a first nozzle, the first nozzle dispensing a polyimide, and
    a second nozzle, the second nozzle dispensing a solvent, the dispensed solvent and the dispensed polyimide combining to form a coating.

11. The system of claim 10 wherein:
    the second nozzle is coupled with a bracket assembly adjustable in three dimensions.

12. The system of claim 11 wherein:
    the bracket assembly comprises a bracket adjustable in an x-axis direction.

13. The system of claim 11 wherein:
    the bracket assembly comprises a bracket adjustable in a y-axis direction.

14. The system of claim 11 wherein:
    the bracket assembly comprises a bracket adjustable in a z-axis direction.

15. The system of claim 10 wherein:
    the first and second nozzles are mounted on an arm.

16. The system of claim 15 comprising:
    means for centering the second nozzle over a wafer holder.

17. The system of claim 10 further comprising:
    a reservoir coupled to the second nozzle, the reservoir containing a solvent for polyimide.

18. The system of claim 17 further comprising:
    a suckback valve interposed between the second nozzle and the reservoir.

19. The system of claim 18 wherein:
    the suckback valve is air operated.

20. The system of claim 10 further comprising:
    means for inhibiting suckback coupled to the second nozzle.

* * * * *